(12) United States Patent
Kim

(10) Patent No.: US 7,834,680 B2
(45) Date of Patent: Nov. 16, 2010

(54) INTERNAL VOLTAGE GENERATION CIRCUIT FOR GENERATING STABLE INTERNAL VOLTAGES WITHSTANDING VARYING EXTERNAL CONDITIONS

(75) Inventor: Dong Kyun Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/775,581

(22) Filed: Jul. 10, 2007

(65) Prior Publication Data

US 2008/0157860 A1 Jul. 3, 2008

(30) Foreign Application Priority Data

Dec. 27, 2006 (KR) .................... 10-2006-0135728

(51) Int. Cl.
G06F 1/10 (2006.01)
G06F 3/02 (2006.01)
(52) U.S. Cl. .................. 327/536; 327/537; 327/538; 327/543
(58) Field of Classification Search ......... 327/536–538, 327/543
See application file for complete search history.

(56) References Cited

U.S. PATENT DOCUMENTS 5,744,998 A * 4/1998 Ito et al. .................... 327/537
5,859,560 A * 1/1999 Matthews .................. 327/513
5,936,443 A * 8/1999 Yasuda et al. ............. 327/143
6,005,434 A * 12/1999 Tsukikawa et al. ........ 327/537
6,201,437 B1 * 3/2001 Kono et al. ................ 327/545
6,297,624 B1 * 10/2001 Mitsui et al. .............. 323/316
6,927,620 B2 * 8/2005 Senda ....................... 327/536
7,224,208 B2 * 5/2007 Matsushita ................ 327/538
2002/0053943 A1 * 5/2002 Yamasaki et al. ......... 327/538
2005/0237104 A1 * 10/2005 Chou ........................ 327/538

FOREIGN PATENT DOCUMENTS

KR 1020040095891 A 11/2004
KR 1020050012002 A 1/2005
KR 10-0818105 B1 3/2008

* cited by examiner

Primary Examiner—Lincoln Donovan
Assistant Examiner—John W Poos
(74) Attorney, Agent, or Firm—Ladas & Parry LLP

(57) ABSTRACT

There is provided an internal voltage generation circuit generating an internal voltage used for a semiconductor memory device. The internal voltage generation circuit includes a current mirror type internal voltage detector generating a comparison voltage and comparing the comparison voltage with a reference voltage to output the comparison result as a detection signal, and a charge pump outputting the internal voltage and controlling the level of the internal voltage by the detection signal. The current mirror type internal voltage detector generates a comparison voltage whose level is determined in accordance with the output of the current mirror having a variable current source in which current varies in accordance the output internal voltage.

18 Claims, 3 Drawing Sheets

US 7,834,680 B2

INTERNAL VOLTAGE GENERATION CIRCUIT FOR GENERATING STABLE INTERNAL VOLTAGES WITHSTANDING VARYING EXTERNAL CONDITIONS

CROSS-REFERENCE TO RELATED APPLICATIONS

The present application claims priority to Korean patent application number 10-2006-0135728 filed on Dec. 27, 2006, which is incorporated herein by reference in its entirety.

BACKGROUND OF THE INVENTION

The present invention relates to a voltage generation circuit, and more particularly, to an internal voltage generation circuit that generates an internal voltage used for a semiconductor memory device.

In general, a semiconductor memory device generates various internal voltages each having a uniform level for a stable operation. In particular, a semiconductor memory device generates and provides a back bias voltage to its MOS transistors in order to reduce leakage currents and to stabilize the threshold voltage.

The internal voltages including the back bias voltage must be maintained to a voltage level in a predetermined range regardless of any changes in processes, voltage, and temperature (PVT) for a stable operation. Therefore, a detection circuit for detecting a change in the internal voltage level must be provided in order to maintain an internal voltage level in a uniform range.

A conventional back bias voltage detection circuit as shown in FIG. 1 outputs a detection signal DET0 based on the turn on resistance difference of PMOS transistors P1 and P2 by monitoring the internal power source voltage VINT, the external ground voltage VSS, and the back bias voltage VBB, as their voltage levels change internally.

That is, when the level of the back bias voltage VBB becomes lower than the level of the ground voltage VSS, the voltage formed between the gate and the source of the PMOS transistor P2 will increase, which will in turn cause the resistance of the PMOS transistor P2 to be lower than the resistance of the PMOS transistor P1. Then, the potential at the node ND1 would vary in response to the changes in the resistance ratio between the PMOS transistors P1 and P2.

When the potential at the node ND1 is less than the threshold voltage of an MOS transistor-type pull-up device having an inverter INV, the detection signal DET0 would transition from the ground voltage VSS to the power source voltage VDD by the MOS transistor-type pull-up device.

The transition point of the detection signal DET0 can be set to a predetermined level previously by controlling the sizes of the PMOS transistors P1 and P2. The level of the back bias voltage VBB is controlled in response to the transition point of the detection signal DET.

That is, the conventional back bias voltage detection circuit as shown in FIG. 1 monitors the changes in the back bias voltage VBB level through the operations of the PMOS transistors P1 and P2 and the inverter INV to output the detection signal DET0, and the level of the back bias voltage VBB is controlled in accordance with the state of the detection signal DET0.

However, problems lie in that the level of the internal power source voltage VINT or the characteristics of the PMOS transistors P1 and P2 and the inverter INV can change as the process conditions change in the conventional back bias voltage detection circuit shown in FIG. 1.

In this case, now referring to FIG. 2, the voltage level variations at the node ND1 become severe causing the detection signal DET0 level to vary widely such that the skew of the detection point becomes large.

SUMMARY OF THE INVENTION

The present invention provides an internal voltage generation circuit capable of reducing the changes in the detection point of an internal voltage in accordance with any changes in the process.

According to an aspect of the present invention, there is provided an internal voltage generation circuit. The internal voltage generation circuit includes a current mirror type internal voltage detector generating a comparison voltage and comparing the comparison voltage with a reference voltage to output the comparison result as a detection signal and a charge pump outputting the internal voltage and controlling the level of the internal voltage by the detection signal.

The internal voltage preferably has a negative voltage level.

The internal voltage detector generates a comparison voltage whose level is determined in accordance with an output of a current mirror having a variable current source.

The current of the variable current source varies in accordance with the internal voltage.

The current mirror type internal voltage detector preferably includes a current mirror driven by the variable current source in which current varies in accordance with the internal voltage and a fixed current source to output a driving control signal, a driver controlling the amount of current in accordance with the driving control signal and outputting the comparison voltage of the level corresponding to the current, and a comparison unit comparing the comparison voltage with the reference voltage to output the comparison result as the detection signal.

In the structure of the current mirror type internal voltage detector, the current mirror preferably includes first and second PMOS transistors having a common gate terminal connected to a first node and connected between a power source voltage line and the first node and the power source voltage line and a second node to form a current mirror, first and second NMOS transistors having a common gate terminal connected to the second node and connected between the first node and a third node and the second node and a ground voltage line to form a current mirror, and a first resistor connected between the third node and the internal voltage line. The driving control signal is preferably output to the first node.

The driver preferably includes a current source controlling the amount of current in accordance with the driving control signal and a load outputting the comparison voltage having a level corresponding to the current.

The current source preferably includes a third PMOS transistor controlling the amount of the current provided by a power source voltage in accordance with the driving control signal.

The sizes of the first to third PMOS transistors and the first and second NMOS transistors are preferably the same.

The load preferably includes a second resistor connected between the current source and a ground voltage line.

In the structure of the current mirror type internal voltage detector, the comparison unit preferably includes an operation amplifier receiving the comparison voltage to a non-inversion input terminal and receiving the reference voltage to an inversion input terminal to output the detection signal.

According to another aspect of the present invention, there is provided an internal voltage generation circuit. The internal voltage generation circuit includes a current mirror driven by a variable current source in which current varies in accordance with an internal voltage and a fixed current source to output a driving control signal, a driver controlling the amount of current in accordance with the driving control signal and outputting the comparison voltage of the level corresponding to the current, a comparison unit comparing the comparison voltage with a reference voltage to output the comparison result as a detection signal, and a charge pump outputting the internal voltage and controlling the level of the internal voltage by the detection signal.

The internal voltage preferably has a negative voltage level.

The current mirror preferably includes first and second PMOS transistors having a common gate terminal connected to a first node and connected between a power source voltage line and the first node and the power source voltage line and a second node to form a current mirror, first and second NMOS transistors having a common gate terminal connected to the second node and connected between the first node and a third node and the second node and a ground voltage line to form a current mirror, and a first resistor connected between the third node and the internal voltage line. The driving control signal is preferably output to the first node.

The driver preferably includes a current source controlling the amount of current in accordance with the driving control signal and a load outputting the comparison voltage having a level corresponding to the current.

The current source further preferably includes a third PMOS transistor controlling the amount of the current provided by a power source voltage in accordance with the driving control signal.

The sizes of the first to third PMOS transistors and the first and second NMOS transistors are the same.

The load preferably includes a second resistor connected between the current source and a ground voltage line.

The comparison unit preferably includes an operation amplifier receiving the comparison voltage to a non-inversion input terminal and receiving the reference voltage to an inversion input terminal to output the detection signal.

DESCRIPTION OF SPECIFIC EMBODIMENTS

Hereinafter, embodiments of the present invention will be described, and various other features as well as advantages which characterize the present invention will be apparent from a reading of the following detailed description and the associated drawings.

An internal voltage generation circuit according to an embodiment of the present invention generates a comparison voltage corresponding to an internal voltage that varies by a current mirror and compares the level of the comparison voltage with the level of the reference voltage to control the level of the internal voltage.

According to an embodiment of the present invention, an internal voltage VI has a negative voltage level like a back bias voltage VBB. A reference voltage VREF has an absolute value corresponding to the target level of the internal voltage VI. An internal power source voltage VINT can be replaced by an external power source voltage.

Figure 1:
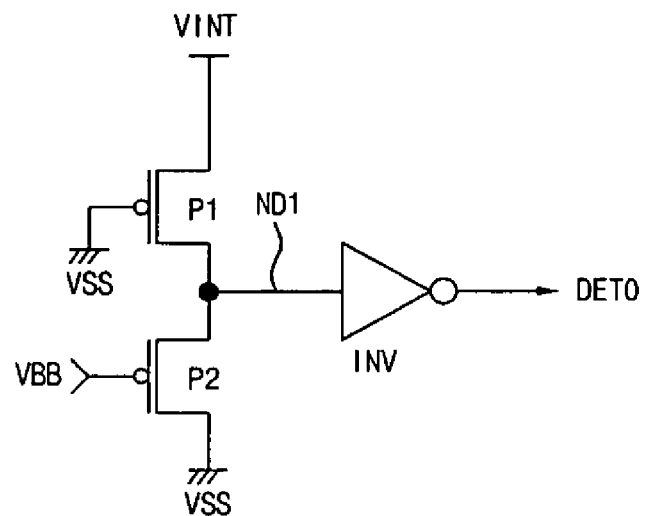
FIG. 1 shows a circuit diagram of a conventional internal voltage detection circuit.
Figure 2:
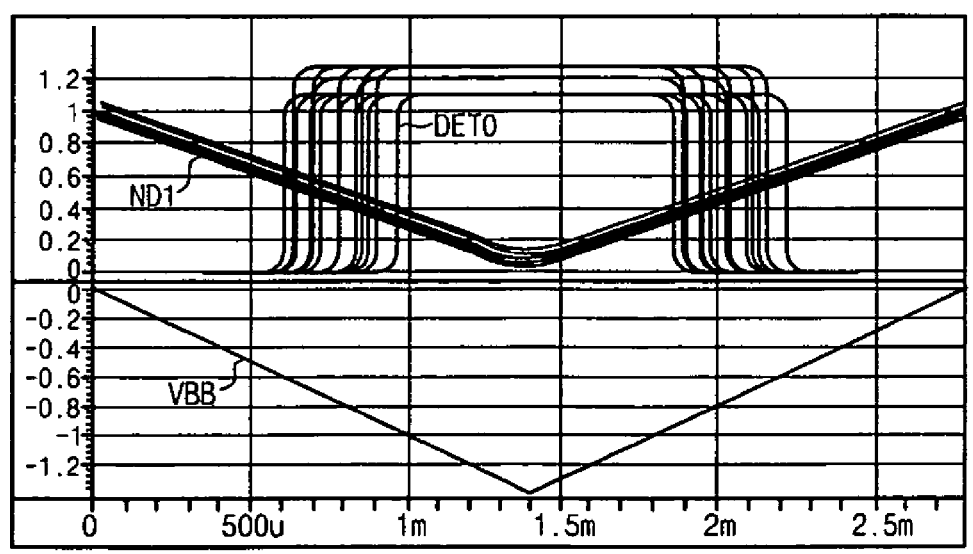
FIG. 2 shows the waveforms of changing voltage levels at the node ND1 and of the detection signal DET1 and the back bias voltage VBB shown in FIG. 1 under changing process conditions.
Figure 3:
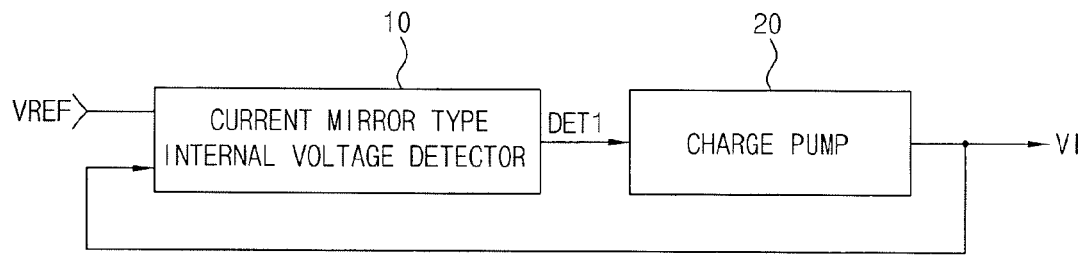
FIG. 3 is a block diagram of an internal voltage generation circuit according to an embodiment of the present invention.

Referring to FIG. 3, the internal voltage generation circuit according to an embodiment of the present invention includes a current mirror type internal voltage detector 10 that compares the level of the feedback internal voltage VI with the level of the reference voltage VREF to output a detection signal DET1 and a charge pump 20 that controls the level of the internal voltage VI based on the detection signal DET.

Figure 4:
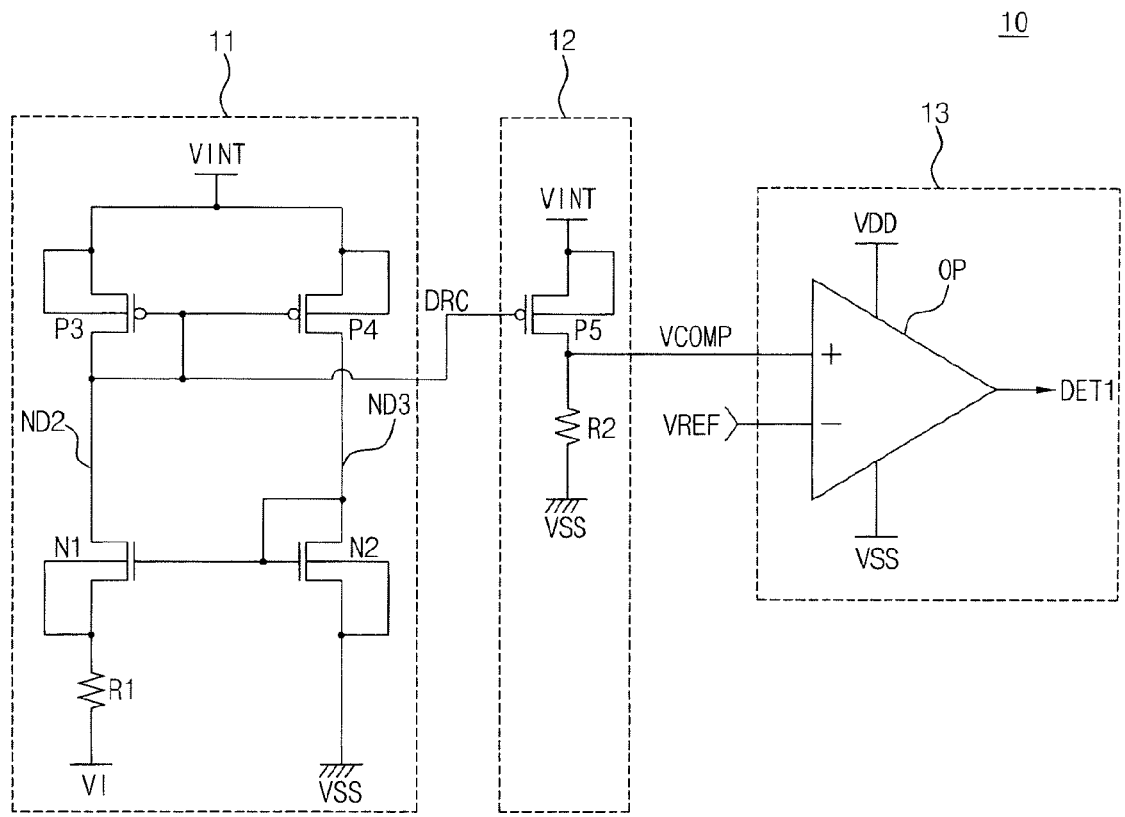
FIG. 4 is a circuit diagram illustrating the current mirror type internal voltage detector 10 of FIG. 3.

As shown in FIG. 4, the current mirror type internal voltage detector 10 includes: a current mirror unit 11 driven by a variable current source varying the current in response the feedback internal voltage VI and a fixed current source to output a driving control signal DRC; a driver 12 controlling the amount of current in response to the driving control signal DRC and outputting a comparison voltage VCOMP of the level corresponding to the current; and a comparison unit 13 that compares the comparison voltage VCOMP and the reference voltage VREF to output the comparison result as a detection signal DET1.

The current mirror unit 11 includes a PMOS transistor P3 connected between the internal power source voltage VINT and a node ND2, a PMOS transistor P4 connected between the internal power source voltage VINT and a node ND3, an NMOS transistor N1 connected between the node ND2 and a resistor R1, an NMOS transistor N2 connected between the node ND3 and a ground voltage VSS, and the resistor R1 connected between the NMOS transistor N1 and the internal voltage VI. Here, the gate terminals of the two PMOS transistors P3 and P4 are commonly connected to the node ND2 and the gate terminals of the two NMOS transistors N1 and N2 are commonly connected to the node ND3.

In the above structure, the two PMOS transistors P3 and P4 and the two NMOS transistors N1 and N2 form current mirrors, respectively, and the current formed by the internal voltage VI and the resistor R1 is provided as the driving control signal DRC through the node ND2.

For current mirror operations, the two PMOS transistors P3 and P4 and the two NMOS transistors N1 and N2 preferably have the same size.

The driver 12 includes a PMOS transistor P5 that controls the amount of current provided by the internal power source voltage VINT in accordance with the driving control signal DRC and a resistor R2 connected between the PMOS transistor P5 and the ground voltage VSS.

In the above structure, the PMOS transistor P5 and the resistor R2 are connected in series such that the comparison voltage VCOMP is provided to the comparison unit 13 at the node connecting the PMOS transistor P5 and the resistor R2, and the level of the comparison voltage VCOMP is determined by the current supplied through the resistor R2 which is connected in series with the PMOS transistor P5.

In order to supply current through the resistor R2 which current should be same as the current at the node ND2, the size of the PMOS transistor P5 is preferably the same size of the two PMOS transistors P3 and P4 and the two NMOS transistors N1 and N2 of the current mirror unit 11.

The comparison unit 13 includes an operational amplifier OP that compares the comparison voltage VCOMP and the reference voltage VREF and outputs the comparison result as the detection signal DET. Here, the operational amplifier OP is driven by a power source voltage VDD and a ground voltage VSS, the non-inversion terminal (+) of the operational amplifier OP receives the comparison voltage VCOMP, and the inversion terminal (−) of the operational amplifier OP receives the reference voltage VREF.

The details of the internal voltage VI detection operations of the current mirror type internal voltage detector 10 having the above structure will be described in detail as follows.

First, the currents that flow through the node ND2 and the node ND3 are same due to the PMOS transistors P3 and P4 and the NMOS transistors N1 and N2 of the current mirror structure. A node between the NMOS transistor N1 and the resistor R1 is then at the ground voltage level (i.e., same as VSS) by a virtual short phenomenon.

Therefore, the level of the voltage formed between both ends of the resistor R1 is same as the internal voltage VI level. When the level of the internal voltage VI changes, the current i(VI), which is proportional to the internal voltage VI level changes, flows through the resistor R1. The current i(VI) is obtained by dividing the internal voltage VI by the resistance of R1.

Since the same current i(VI) flows through the PMOS transistor P3 connected to the same node ND2 as the resistor R1, the same current i(VI) flows through the PMOS transistor P5 by the driving control signal DRC.

As a result, the comparison voltage VCOMP can be obtained by dividing the resistor R2 by the resistor R1 and then multiplying the division result by the internal voltage VI, i.e., VCOMP=(R2/R1)*VI. That is, the voltage level of the comparison voltage VCOMP increases when the level of the internal voltage VI is decreases, and the voltage level of the comparison voltage VCOMP decreases when the level of the internal voltage VI increases.

The operational amplifier OP compares the comparison voltage VCOMP whose level changes in accordance with the internal voltage VI with the reference voltage VREF having a predetermined voltage level to output the detection signal DET1.

Figure 5:
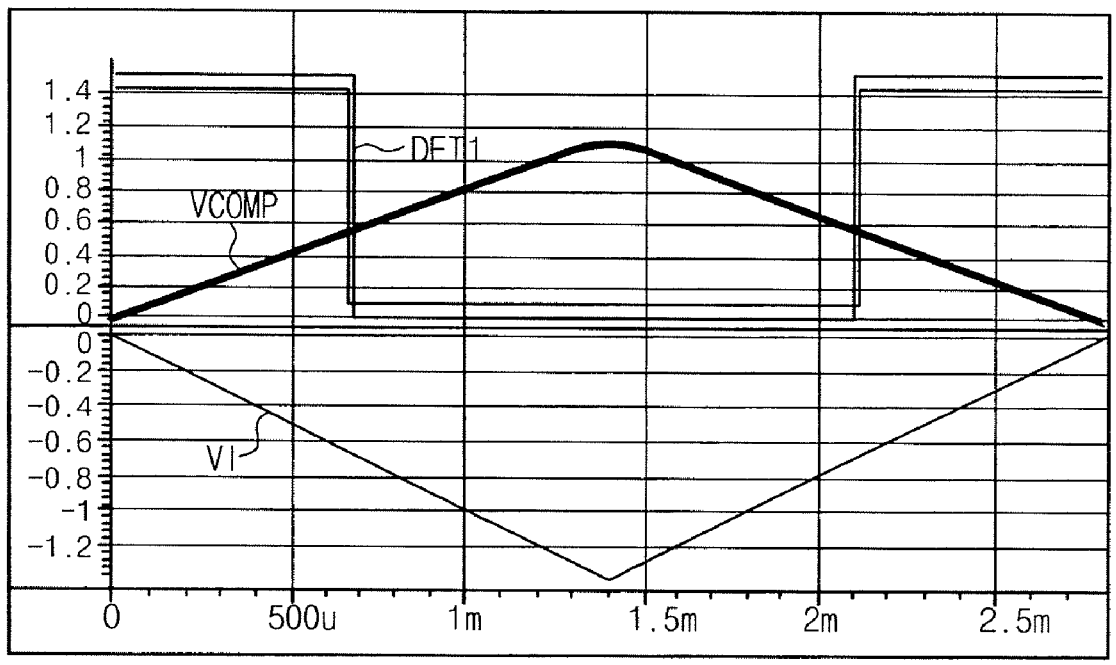
FIG. 5 shows the waveforms of changing voltage levels of the comparison voltage VCOMP, the detection signal DET1, and the internal voltage V1 as shown in FIG. 3 under changing process conditions.

For example, as illustrated in FIG. 5, when the target level of the internal voltage VI is set as −0.6V but the level of the internal voltage VI is lowered, the comparison voltage VCOMP would increase to 0.6V, the detection signal DET1 is transitioned from a high level to a low level. On the other hand, when the level of the internal voltage VI increases so that the comparison voltage VCOMP is reduced to 0.6V, the detection signal DET1 is transitioned from the low level to the high level.

As described above, the current mirror type internal voltage detector 10 outputs the detection signal DET1 whose level is transitioned in accordance with the changes in the level of the internal voltage VI, and the charge pump 20 controls the level of the internal voltage VI by the detection signal DET1 to output the internal voltage VI that maintains the level in a predetermined range based on the target level.

The charge pump 20 repeats charge or discharge in accordance with the detection signal DET1 using a capacitor device to control the level of the internal voltage VI. The charge pump 20 could be one of those that are well-known in the industry, as such the detailed description about the charge pump 20 is omitted.

As described above, according to an embodiment of the present invention, the comparison voltage VCOMP corresponding to the internal voltage VI is generated using the current mirror structure. The generated comparison voltage VCOMP is compared with the reference voltage VREF to detect the level of the internal voltage VI, and the level of the internal voltage VI is controlled in accordance with the detection result.

In particular, in detecting the level of the internal voltage VI, according to an embodiment of the present invention, the variable current corresponding to the changes in the internal voltage VI is copied to generate the comparison signal VCOMP.

Therefore, according to an embodiment of the present invention, since the level of the comparison signal VCOMP does not significantly change due to the changes in the process conditions, the skew related to the detection points of the internal voltage level changes under the influence of the process conditions can be reduced.

As described above, according to an embodiment of the present invention, the skew related to the detection points of the internal voltage level changes under the influence of the process conditions can be reduced since the internal voltage level is detected using the current mirror.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An internal voltage generation circuit comprising:
    a current mirror type internal voltage detector configured to detect an internal voltage inputted from a source terminal of a current mirror, generate current proportional to internal voltage and generate a comparing voltage corresponding to the current, and to output a detection signal by comparing the comparison voltage with a reference voltage; and
    a charge pump configured to control the level of the internal voltage based on the detection signal,
    wherein the internal voltage has a negative voltage level.

2. The internal voltage generation circuit as set forth in claim 1, wherein the current mirror type internal voltage detector generates the comparison voltage based on the internal voltage that varies by a current mirror unit.

3. The internal voltage generation circuit as set forth in claim 2, wherein the current mirror type internal voltage detector generates the comparison voltage which voltage level is determined in accordance with an output of the current mirror unit having a variable current source.

4. The internal voltage generation circuit as set forth in claim 3, wherein the current of the variable current source varies in accordance with the internal voltage.

5. The internal voltage generation circuit as set forth in claim 4, wherein the current mirror type internal voltage detector comprises:
    a current mirror unit driven by the variable current source with current varying in accordance with the internal voltage and a fixed current source and outputting a driving control signal;
    a driver controlling the amount of current in accordance with the driving control signal and outputting the comparison voltage having a voltage level corresponding to the current; and
    a comparison unit comparing the comparison voltage and the reference voltage and outputting the comparison result as the detection signal.

6. The internal voltage generation circuit as set forth in claim 5, wherein the current mirror unit comprises:
   first and second PMOS transistors having a common gate terminal connected to a first node and connected between a power source voltage line and the first node and the power source voltage line and a second node to form a first current mirror;
   first and second NMOS transistors having a common gate terminal connected to the second node and connected between the first node and a third node and the second node and a ground voltage line to form a second current mirror; and
   a first resistor connected between the third node and the internal voltage line,
   wherein the driving control signal is outputted to the first node.

7. The internal voltage generation circuit as set forth in claim 6, wherein the driver comprises:
   a current source controlling the amount of current in accordance with the driving control signal; and
   a load outputting the comparison voltage having a level corresponding to the current controlled by the current source.

8. The internal voltage generation circuit as set forth in claim 7, wherein the current source comprises a third PMOS transistor controlling the amount of the current provided by a power source voltage in accordance with the driving control signal.

9. The internal voltage generation circuit as set forth in claim 8, wherein the sizes of the first to third PMOS transistors and the first and second NMOS transistors are the same.

10. The internal voltage generation circuit as set forth in claim 7, wherein the load comprises a second resistor connected between the current source and a ground voltage line.

11. The internal voltage generation circuit as set forth in claim 5, wherein the comparison unit further comprises an operation amplifier receiving the comparison voltage to a non-inversion input terminal and receiving the reference voltage to an inversion input terminal to output the detection signal.

12. An internal voltage generation circuit, comprising:
   a current mirror unit configured to detect an internal voltage inputted from a source terminal by being driven by a variable current source in which current varies in proportion to the internal voltage and a fixed current source to output a driving control signal corresponding to the internal voltage;
   a driver configured to control the amount of current in accordance with the driving control signal and outputting the comparison voltage of the level corresponding to the internal voltage;
   a comparison unit configured to compare the comparison voltage with a reference voltage to output the comparison result as a detection signal; and
   a charge pump configured to control the level of the internal voltage by the detection signal,
   wherein the internal voltage has a negative voltage level.

13. The internal voltage generation circuit as set forth in claim 12, wherein the current mirror unit comprises:
   first and second PMOS transistors having a common gate terminal connected to a first node and connected between a power source voltage line and the first node and the power source voltage line and a second node to form a first current mirror;
   first and second NMOS transistors having a common gate terminal connected to the second node and connected between the first node and a third node and the second node and a ground voltage line to form a second current mirror; and
   a first resistor connected between the third node and the internal voltage line,
   wherein the driving control signal is outputted to the first node.

14. The internal voltage generation circuit as set forth in claim 13, wherein the driver comprises:
   a current source controlling the amount of current in accordance with the driving control signal; and
   a load outputting the comparison voltage having a level corresponding to the current controlled by the current source.

15. The internal voltage generation circuit as set forth in claim 14, wherein the current source comprises a third PMOS transistor controlling the amount of the current provided by a power source voltage in accordance with the driving control signal.

16. The internal voltage generation circuit as set forth in claim 15, wherein the sizes of the first to third PMOS transistors and the first and second NMOS transistors are the same.

17. The internal voltage generation circuit as set forth in claim 14, wherein the load comprises a second resistor connected between the current source and a ground voltage line.

18. The internal voltage generation circuit as set forth in claim 12, wherein the comparison unit further comprises an operation amplifier receiving the comparison voltage to a non-inversion input terminal and receiving the reference voltage to an inversion input terminal to output the detection signal.

* * * * *